(12) United States Patent
Koshka

(10) Patent No.: US 7,404,858 B2
(45) Date of Patent: Jul. 29, 2008

(54) METHOD FOR EPITAXIAL GROWTH OF SILICON CARBIDE

(75) Inventor: Yaroslav Koshka, Starkville, MS (US)

(73) Assignee: Mississippi State University, Mississippi State, MS (US)

( * ) Notice: Subject to any disclaimer, the term of this patent is extended or adjusted under 35 U.S.C. 154(b) by 0 days.

(21) Appl. No.: 11/521,869

(22) Filed: Sep. 15, 2006

(65) Prior Publication Data
US 2007/0062441 A1 Mar. 22, 2007

Related U.S. Application Data

(60) Provisional application No. 60/717,695, filed on Sep. 16, 2005.

(51) Int. Cl.
*C30B 25/12* (2006.01)

(52) U.S. Cl. .............. 117/95; 117/84; 117/89; 117/92

(58) Field of Classification Search .......... 117/84, 117/89, 92, 95
See application file for complete search history.

(56) References Cited

U.S. PATENT DOCUMENTS

| | | | |
|---|---|---|---|
| 5,591,492 A | 1/1997 | Hirai et al. | |
| 6,402,836 B1 | 6/2002 | Leycuras | |
| 6,767,783 B2 * | 7/2004 | Casady et al. | 438/234 |
| 6,814,801 B2 | 11/2004 | Jenny et al. | |
| 6,872,637 B2 * | 3/2005 | Pickering et al. | 438/483 |

2001/0015170 A1 8/2001 Kitabatake

OTHER PUBLICATIONS

Powell, J. A. and Will, H.A., "Epitaxial Growth of 6H SiC in the Temperature Range 1320-1390° C," J. Appl. Phys., vol. 44, No. 11, pp. 5177-5178, 1973.
Nishino, S. et al., "Epitaxial Growth of SiC on α-SiC Using Si2Cl6+C3H8+H2 System," Mater. Sci. For., vols. 264-268, pp. 139-142, 1998.
Yamashita, A. et al., "Homoepitaxial Chemistry Vapor Deposition of 6H-SiC at Low Temperatures on {0114} Substrates," Jpn. J. Appl. Phys., vol. 31, pp. 3655-3661, 1992.
Xie, Z. Y. et al., "Polytype Controlled SiC Epitaxy on On-axis 6H-SiC(0001) by Adding HCl during Growth," Electrochemical and Solid-State Letters, 3(8), pp. 381-384, 2000.
Koshka, Y. et al., "Homoepitaxial Growth of 4H-SiC Using CH3Cl Carbon Precursor," Mater. Sci. For., vols. 483-485, pp. 81-84, 2005.

(Continued)

*Primary Examiner*—Felisa C Hiteshew
(74) *Attorney, Agent, or Firm*—Kristin L. McCandless

(57) ABSTRACT

A method for epitaxial growth of silicon carbide using chemical vapor deposition (CVD) is provided. This method utilizes halogenated carbon precursors and control of the gas-phase interaction of halogen-containing intermediate chemical products involving silicon and carbon, which ensures quality and homogeneity across the silicon carbide crystals. It also ensures a possibility to achieve device-quality epitaxial layers at lower growth temperatures as well as on on-axis or low off-angle substrate surfaces. The growth method can be applied to forming SiC device regions of desirable shape and dimensions by restricting the growth into windows formed in non-silicon carbide region on the top of SiC substrate. Application of the methods described herein will greatly benefit the production of high quality silicon carbide materials and devices.

31 Claims, 2 Drawing Sheets

OTHER PUBLICATIONS

Ikoma, K. et al., "Heteroepitaxial Growth of β-SiC on Si (111) by CVD Using a CH3Cl-SiH4-H2 Gas System," J. Electrochem. Soc., vol. 138, No. 10, pp. 3028-3031, 1991.

Gao, Y. et al., "Low-temperature Chemical-vapor Deposition of 3C-SiC Films on Si (100) Using SiH4-C2H4-HCl-H2," J. Crystal. Growth, 191, pp. 439-445, 1998.

Jeong, J. K. et al., "Low Temperature 4H-SiC Epitaxial Growth on 4H-SiC (1120) and (1100) Faces by Organometallic Chemical Vapor Deposition,".

J. Electrochem. Soc., vol. 149, No. 9, pp. G526-G531, 2002.

* cited by examiner

METHOD FOR EPITAXIAL GROWTH OF SILICON CARBIDE

CROSS-REFERENCE TO RELATED APPLICATION

This application claims the benefit of U.S. Provisional Application Ser. No. 60/717,695, filed Sep. 16, 2005. The entire disclosure of this priority application is incorporated herein by reference in its entirety.

This invention was made with Government support under grant number N00014-04-1-0260 awarded by the Office of Naval Research. The government may have certain rights in this invention.

TECHNICAL FIELD OF THE INVENTION

This invention relates to the epitaxial growth of device-quality silicon carbide layers. It further relates to epitaxial growth of silicon carbide layers by chemical vapor deposition using halogenated carbon precursors.

BACKGROUND OF THE INVENTION

Epitaxial growth of silicon carbide (SiC) is traditionally conducted by chemical vapor deposition (CVD) with silane and propane precursors at temperatures in excess of 1500° C. Other sources were occasionally used instead of silane and propane including single-precursors containing both silicon and carbon components or precursors containing chlorine (Cl) and other molecules. See Powell, J. A. and Will, H. A., "Epitaxial Growth of 6H SiC in the Tempetature Range 1320-1390° C.," *J. Appl. Phys.*, Vol. 44, No. 11, pp. 5177-5178, 1973; and Nishino, S. et al., "Epitaxial Growth of SiC on a α-SiC Using $Si_2Cl_6+C_3H_8+H_2$ System," *Mater. Sci. For.*, Vols. 264-268, pp. 139-142, 1998. Epitaxial growth with the traditional growth precursor gasses at temperatures below 1400° C. was also attempted in the research environment with limited success. See Yamashita, A. et al., "Homoepitaxial Chemical Vapor Deposition of 6H—SiC at Low Temperatures on {0114} Substrates," *Jpn. J. Appl. Phys.*, Vol. 31, pp. 3655-3661, 1992.

Elevated temperatures are required to provide: (1) efficient decomposition of the gaseous precursors to form reaction products required for epitaxial growth; (2) suppressed formation or enhanced dissociation of silicon clusters that may form in the reactor; and (3) suppressed two-dimensional and three-dimensional nucleation at the surface in favor of desirable step-flow growth mechanism. If conducted at reduced temperatures (below 1400-1450° C.), the epitaxial growth on SiC surface of arbitrary orientation may result in polytype inclusions, degraded morphology, and even in polycrystalline material. Only growth on selected surface orientations was reported to produce promising growth morphology at reduced temperatures. See Powell, J. A. and Will, H. A., "Epitaxial Growth of 6H SiC in the Temperature Range 1320-1390° C.," *J. Appl. Phys.*, Vol. 44, No. 11, pp. 5177-5178, 1973; and Nishino, S. et al., "Epitax Growth of SiC on a α-SiC Using $Si_2Cl_6+C_3H_8+H_2$ System," *Mater. Sci. For.*, Vols. 264-268, pp. 139-142, 1998; Yamashita, A. et al., "Homoepitaxial Chemical Vapor Deposition of 6H—SiC at Low Temperatures on {0114} Substrates," *Jpn. J. Appl. Phys.*, Vol. 31, pp. 3655-3661, 1992. Also, most of the low-temperature homoepitaxial growth experiments were focused on 6H—SiC polytype.

For these reasons, temperatures in excess of 1450° C. are normally used for epitaxial growth of 4H- and 6H—SiC polytypes on 4H- and 6H—SiC substrates respectively. 3C—SiC polytype is grown heteroepitaxially on silicon substrates at temperatures below 1300° C., however, attempts to reduce growth temperatures normally result in epitaxial layer quality degradation. On the other hand, growth at high temperatures introduces a number of complications. First, there are important cost issues including degradation of the reactor hardware—e.g., quartz, susceptor, substrate holder, etc. Second, high-temperature growth may complicate control of the incorporation of dopants and other impurities in the grown epilayer. Third, high temperatures may increase lattice defect generation, surface roughness and surface morphology degradation. In addition, high-temperature growth on lower off-angle and on-axis substrates results in bad quality materials.

Addition of halogenated precursors and other additional components (including HCl, chlorinated sources of silane, etc.) was proposed and attempted to improve surface and gas-phase reaction mechanisms (see Nishino, S. et al., "Epitaxial Growth of SiC on a α-SiC Using $Si_2Cl_6+C_3H_8+H_2$ System," *Mater. Sci. For.*, Vols. 264-268, pp. 139-142, Xie, Z. Y. et al., "Polytype Controlled SiC Epitaxy on On-axis 6H—SiC(0001) by Adding HCl during Growth," *Electrochemical and Solid-State Letters*, 3(8), pp. 381-384, 2000; and Koshka, Y. et al., "Homoepitaxial Growth of 4H—SiC Using $CH_3Cl$ Carbon Precursor," *Mater. Sci. For.*, Vols. 483-485, pp. 81-84, 2005) at regular growth temperature (i.e., in excess of 1450-1500° C.). However, it has not received any significant commercial use and has not been applied to achieve lower-temperature homoepitaxial growth.

Use of $CH_3Cl$ in epitaxial growth of SiC has been reported for SiC heteroepitaxial growth (i.e., 3C—SiC on silicon). See Ikoma, K. et al., "Heteroepitaxial Growth of β-SiC on Si (111) by CVD Using a $CH_3Cl$—$SiH_4$—$H_2$ Gas System," *J. Electrochem. Soc.*, Vol. 138, No. 10, pp. 3028-3031, 1991. However, control of the of the gas-phase interaction involving halogenated carbon precursors was not disclosed. Therefore, since the gas-phase interaction constituting the nature of the present invention was not disclosed and no significant benefits of using $CH_3Cl$ growth precursor were realized, there has been no continuation of work with halogenated carbon precursors.

For the homoepitaxial growth of SiC (4H—SiC epitaxial layer on 4H—SiC substrates or 6H—SiC epitaxial layer on 6H—SiC substrates), no halogenated carbon precursors had ever been used prior to our invention. More importantly, without the invention of the new mechanism of the gas-phase interaction involving halogenated carbon precursors, a straightforward attempt to use halogenated carbon precursor would not provide any of the benefits that are provided by our invention.

SUMMARY OF THE INVENTION

The invention includes a new growth method for chemical vapor deposition epitaxial growth of SiC that enables growth at temperatures below 1450° C. (down to and below 1300° C.) as well as improved growth processes at regular growth temperatures (i.e., above 1450° C.). The invention also includes application of the new method to growth of device-quality epitaxial layers on low off-angle and on-axis substrates. The new growth process also provides improved control over defect and impurity incorporation, better homogeneity of the growth rate across the substrate area (even without employing substrate rotation during the growth process), improved crystal quality, and surface morphology. Additionally, the method of the present invention may be applied to form SiC regions of desirable shape and dimensions by restricting the growth into the windows formed in a non-silicon carbide region on the top of the substrate (which is also called selective epitaxial growth). Furthermore, by conducting the growth method of the present invention at lower temperatures (e.g., below the melting point of silicon substrates/regions or at temperatures that are safe for a wide group of masking materials), it is possible to use non-silicon carbide region on the top of SiC substrate (i.e., masking regions) made of low-temperature masking materials. This enables innovative device designs not possible with the prior epitaxial growth technologies.

BRIEF DESCRIPTION OF THE FIGURES

These drawings accompany the detailed description of the invention and are intended to illustrate further the invention and its advantages.

DETAILED DESCRIPTION OF THE INVENTION

The innovative concepts included in this description, which were experimentally demonstrated by the applicant, can be used separately as well as in combination to provide a low-temperature as well as medium- and high-temperature processes for Silicon Carbide (SiC) epitaxial growth. Included in the present invention is a new growth method/process for epitaxial growth of SiC using chemical vapor deposition.

Figure 1:
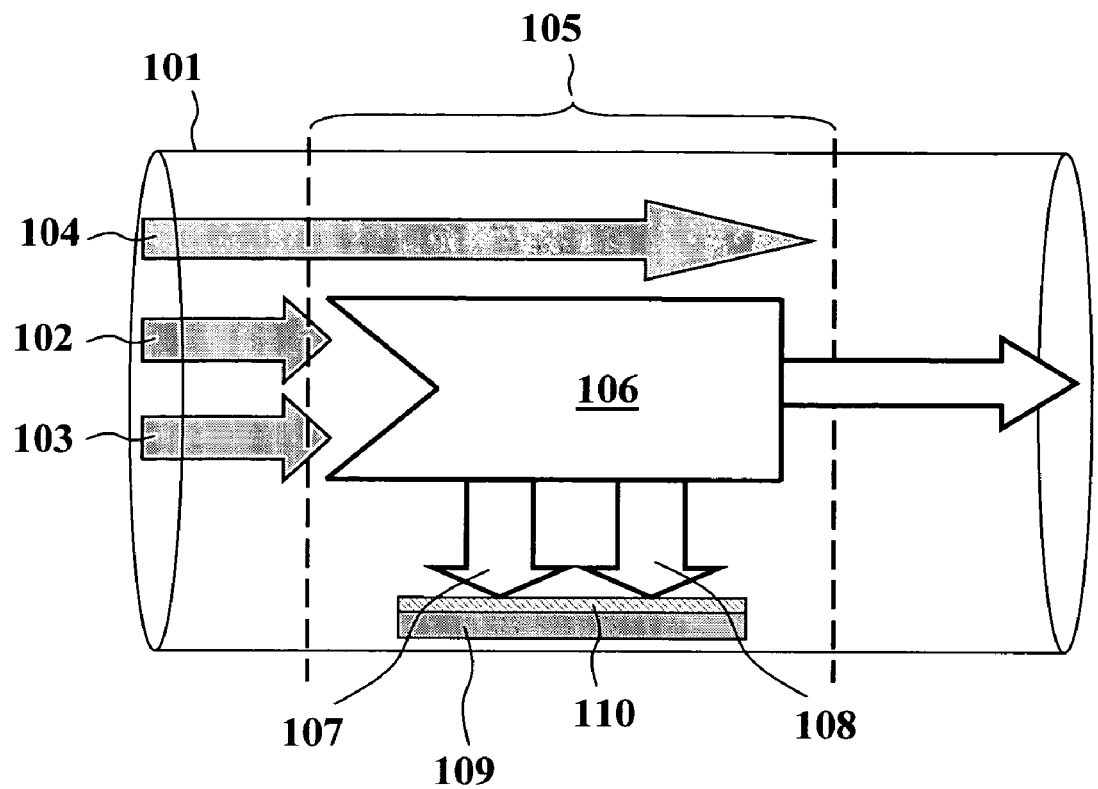
FIG. 1 illustrates a schematic diagram of the main components of the growth method of the present invention.

The preferred epitaxial growth method of the present invention has common features of any chemical vapor deposition (CVD) growth process, as shown in FIG. 1. The growth chamber 101 is maintained at atmospheric pressure or low pressure. Silicon precursor gas 102 and halogenated carbon precursor gas 103 are supplied along with carrier gas 104 that can be hydrogen, argon, helium, or any other common carrier gas. A major difference from the generic processes for SiC epitaxial growth is in the combination of using a halogenated carbon precursor gas 103, replacing traditional hydrocarbons, and regulation of the gas-phase kinetics to ensure formation of specific reaction products as discussed below.

Gas phase chemical reactions take place when the growth precursor gasses reach the hot zone of the reactor 105. In a preferred growth method of the invention, the hot zone of the reactor 105 is ensured by employing a susceptor inside the reactor heated to a desirable temperature. The region of halogen-containing intermediate products 106 of halogenated carbon decomposition forms in the hot zone of the reactor 105.

Halogenated carbon precursor 103 acts as a source of halogen-containing intermediate gaseous reaction products (e.g., Cl, $Cl_x$, etc.). The gas-phase kinetics are controlled to ensure interaction of silicon precursor gas 102 with products of halogenated carbon precursor 103 decomposition to enable formation of halogen-containing intermediate chemical products involving carbon 107 and halogen-containing intermediate chemical products involving silicon 108. The halogen-containing intermediate chemical products involving carbon 107 and halogen-containing intermediate chemical products involving silicon 108 get transported to the surface of the substrate 109 where they contribute to the growth of the SiC epitaxial layer 110.

The specific role of the halogen-containing intermediate chemical products 106 that are formed as a result of the proper adjustment of the gas-phase reaction kinetics involving halogenated carbon gases constitutes the novel and non-obvious components of the invention. Previous methods of epitaxial growth using halogen additives concentrated on enhancing the migration of the ad-atoms at the surface (see Xie, Z. Y. et al., "Polytype Controlled SiC Epitaxy on On-axis 6H—SiC (0001) by Adding HCl during Growth," *Electrochemical and Solid-State Letters*, 3(8), pp. 381-384, 2000) or direct etching of Si clusters in the gas phase (see Gao, Y. et al., "Low-temperature Chemical-Vapor Deposition of 3C—SiC Films on Si (100) using $SiH_4$—$C_2H_4$—HCl—$H_2$," *J. Crystal. Growth*, 191, pp. 439-445, 1998). In the present invention, the formation of halogen-containing intermediate chemical products of halogenated carbon precursor decomposition can lead to drastically suppressed undesirable nucleation in the gas phase and at the substrate surface. Formation of the halogen-containing intermediate chemical products prevents undesirable condensation of silicon vapor in the gas phase. Additionally, in prior epitaxial growth processes, condensation of silicon vapor normally resulted in depletion of the silicon growth precursor and adverse reduction of the silicon-to-carbon ratio. This invention establishes that it is the control of silicon-to-carbon ratio above the growth surface rather than defect formation by silicon clusters on the surface or insufficient degree of the surface migration that is critical for the epilayer morphology. For that reason, direct etching of silicon clusters by HCl or other additives in the reactor or direct etching of the growing SiC layer by HCl or other additives in the reactor could not provide improvements in the process that the applicant achieves by ensuring formation of intermediate chemical products involving silicon, carbon, and halogen-containing products of halogenated carbon precursor decomposition.

The method of the present invention works over a wide range of growth temperatures. The growth temperature is defined as the temperature in the growth zone of the reactor. More specifically, this is the temperature at the surface of the substrate 109. However, the main advantage of the method of the present invention is the unique possibility to conduct epitaxial growth at reduced temperatures (e.g., growth of 4H- and 6H—SiC polytypes at temperatures below 1450° C. and even down to below 1300° C.), which is not possible with the existing epitaxial growth techniques.

Halogenated carbon precursors (including, but not limited to, chlorinated carbons such as chloromethane—$CH_3Cl$, dichloromethane—$CH_2Cl_2$, trichloromethane—$CHCl_3$ etc., and other types of halogenated carbons such as tetrachloromethane—$CCl_4$, tetrafluoromethane—$CF_4$, etc.) are used as a carbon source to provide favorable kinetics of carbon decomposition.

Figure 2:
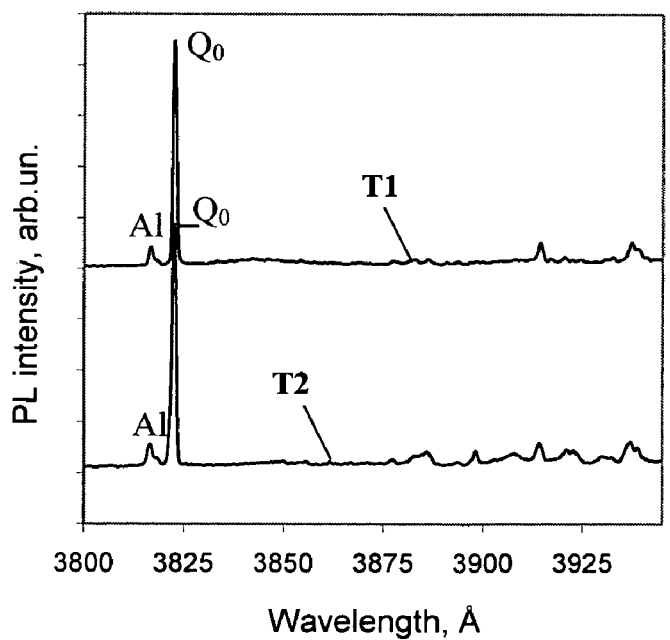
FIG. 2 illustrates the comparison of the photoluminescence spectrum of an epitaxial layer grown by the method of the present invention at 1300° C. to an epitaxial layer grown by the regular epitaxial process at 1700° C.

Using $CH_3Cl$ carbon precursor, the altered gas-phase kinetics enabled growth of device-quality homoepitaxial layers at reduced temperatures down to and below 1300° C. This growth has not been possible prior to this invention. As shown in FIG. 2, specular epilayer surface morphology was obtained. FIG. 2 shows the photoluminescence spectrum (PL) of the epitaxial layer grown by the method of the present invention at 1300° C. (T1), compared to an epitaxial layer grown by the regular epitaxial process at 1700° C. (T2). Photoluminescence intensity (PL intensity) is plotted versus wavelength of the photoluminescence light emitted during the measurements. The standard photoluminescence lines marked using conventional for photoluminescence spectroscopy notations Al and $Q_0$ are shown in FIG. 2. The shape of the photoluminescence lines, as shown, serves as additional evidence that the epitaxial layers are of high crystalline quality. Comparison with traditional epitaxial growth conducted at 1700° C. T2 indicates that the quality of the epitaxial layers grown by the method of the present invention is at least as good as that of the traditional epitaxial layers even though the growth temperature T1 was much lower than minimum possible growth temperatures of traditional growth methods. However, the method of the present invention (novel growth mechanism) works and provides benefits also for homoepitaxy at higher temperatures (including the traditional growth temperatures above 1450° C.). However, the main benefit is in enabling the low-temperature epitaxial growth of SiC.

The targeted growth mechanisms could be achieved under appropriate growth conditions for precursors other than $CH_3Cl$, including for example different halogenated carbon precursors (e.g., dichloromethane—$CH_2Cl_2$, trichloromethane—$CHCl_3$, tetrachloromethane—$CCl_4$, tetrafluoromethane—$CF_4$, etc.), single-precursors (i.e., precursors containing both silicon and carbon molecules), etc. The carrier gas 104 used in the preferred growth method is hydrogen. Other carrier gases, however, including argon, helium, or others may also be used to provide the growth mechanism of the present invention.

As indicated above, the desirable effect of the method of the present invention comes from the gas-phase kinetics that is regulated or controlled to ensure interaction of silicon gas precursors with products of halogenated carbon precursor decomposition to enable formation of halogen-containing intermediate chemical products involving silicon and carbon. The preferable approach to regulating or controlling the gas-phase kinetics utilizes significantly reduced flow rate of the carrier gas 104 (e.g., hydrogen), and therefore reduced flow velocities and increased residence time of the precursors in the reactor, in comparison to the traditionally used carrier gas flow rates. High flow rates in excess of 10 liters per minute of the carrier gas are typically used to achieve more homogeneous precursor decomposition in the standard epitaxial growth processes used for SiC. Lower gas-flow velocity is preferably applied to provide sufficient time for precursor decomposition and formation of halogen-containing intermediate chemical products without degrading the growth rate homogeneity across the substrate area. The flow rates in the range of 1-2 liters per minute or even lower may be employed at reduced growth temperatures (e.g., below 1450° C.), depending on the size of the growth reactor. The 1-2 liters per minute flow rate is preferably used for the standard SiC reactor sizes normally used for 2-3-inch diameter substrates. Larger reactors, however, may require greater hydrogen flow rates to achieve the same effect. The results shown in FIG. 2 were obtained for the carrier gas 104 flow rate of 1 liter per minute.

Figure 3:
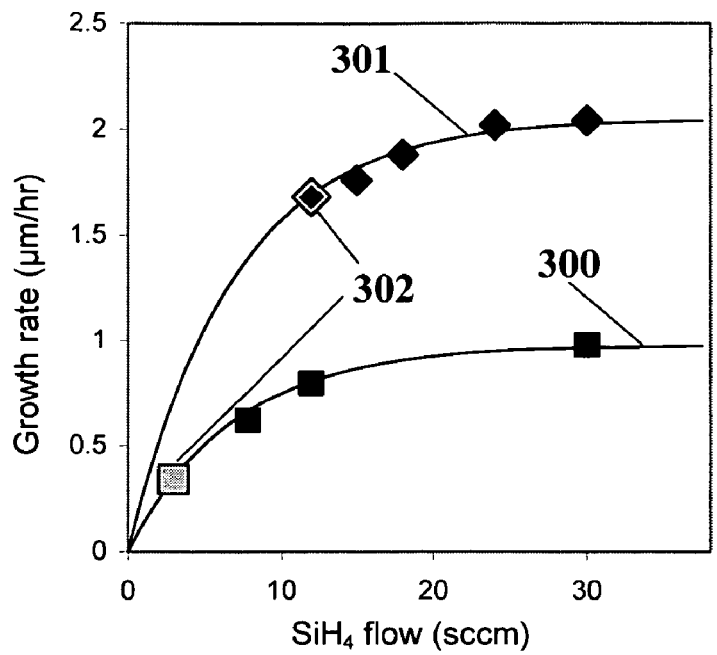
FIG. 3 illustrates the dependence of the growth rate on the flow rate of the silicon precursor ($SiH_4$ flow) for two values of $CH_3Cl$ precursor.

FIG. 3 shows dependence of the growth rate on the flow rate of the silicon precursor gas ($SiH_4$ flow) for two values of $CH_3Cl$ precursor—equal to two standard cubic centimeters per minute 300 and four standard cubic centimeters per minute 301. It was established that achievement of the device-quality SiC epitaxial layers (especially at low temperatures) requires higher values of the silicon-to-carbon ratio in comparison to the values used in the previously existing epitaxial processes. Specifically, while values of silicon-to-carbon ratio below 1 were typically used in most of the previously existing epitaxial processes, the new reaction kinetics provides the best epitaxial layer quality for silicon-to-carbon ratios larger than 3, as follows from FIG. 3. The data points 302 corresponding to the lowest value of $SiH_4$ flow in FIG. 3 had somewhat degraded epitaxial layer morphology in comparison to other data points, confirming the critical importance of maintaining high value of silicon-to-carbon ratio.

No less important is the so-called effective silicon-to-carbon ratio (i.e., the value of the silicon-to-carbon ratio in the growth zone of the reactor) which, in the method of the present invention, is even more different from that utilized in the previously existing epitaxial processes. This difference comes from the silicon condensation in the gas phase causing depletion of silicon growth species. The novel reaction mechanism of the present invention prevents depletion of the silicon species and provides much higher value of the effective silicon-to-carbon ratio.

In an embodiment of the invention, the growth temperature of 1300° C. and the pressure of 150 torr is used. The carrier gas 104 is hydrogen with flow of 1 standard litter per minute. The flows of silicon precursor gas 102, silane ($SiH_4$), and halogenated carbon precursor gas 103, chloromethane ($CH_3Cl$), are 30 standard cubic centimeters per minute and 4 standard cubic centimeters per minute, respectively. Successful experiments were conducted at temperatures down to 1250° C. Our experiments indicate that the growth mechanism of the present invention can work at temperatures down to at least 1100° C. Further reduction of the growth temperature may require addressing other growth mechanisms that become more critical (including low diffusion length of the ad-atoms at the surface at too low temperatures, etc.).

The preferred method of epitaxial growth of the present invention, requiring the control of the decomposition (cracking) kinetics of only one precursor (i.e., carbon precursor) instead of two (i.e., silicon and carbon precursor), provides additional benefits. While the amount of silicon (that decomposes at rather low temperatures) is provided well in excess of the silicon condensation threshold, the control of carbon-source decomposition kinetics is conducted primarily by velocity of the carrier-gas flow (which will be typically lower than traditional carrier-gas velocity used for SiC growth as described earlier).

The use of high rate of silicon condensation and cluster nucleation at reduced temperatures for improved reaction kinetics and growth rate homogeneity is provided for in the preferable growth method. Cluster nucleation is normally an undesirable effect for epitaxial growth of silicon carbide. However, suppressing the precursor depletion along the gas flow direction by inducing silicon condensation and cluster nucleation is possible by using the growth method of the present invention.

This mechanism can be also applied at regular growth temperatures and is dependent on reactor geometry. Using the standard hot-wall 100 mm-diameter CVD reactor, this cluster formation mechanism occurs at low flow rates and at reduced temperatures. This mechanism can be also applied at regular growth temperatures at somewhat higher gas flow velocity (while still lower than in standard growth processes). However, it is particularly efficient and beneficial at reduced temperatures. The cluster formation mechanism enables achieving homogeneous silicon-to-carbon ratio and homogeneous growth rates across the substrate area. It is due to the fact that the amount of silicon in vapor phase available for epitaxial growth at different locations of the susceptor along the gas flow direction is homogenized by the silicon vapor condensation. This homogenization is ensured by having the amount of silicon vapor at the growth region saturated at the maximum concentration required for silicon condensation. The excess of silicon over this amount (for example, downstream of the susceptor in comparison to upstream) becomes converted to silicon clusters and becomes unavailable for the growth. This mechanism is evidenced by the saturation part of the curves representing growth rate dependence on $SiH_4$ flow rate, as shown in FIG. 3. As a result, the concentration of silicon vapor species available for the growth remains homogeneous along the gas flow direction. This growth method may be applied to epitaxial growth on large-diameter substrates to achieve homogeneous growth rate across the wafer area without employing substrate rotation techniques.

Figure 4:
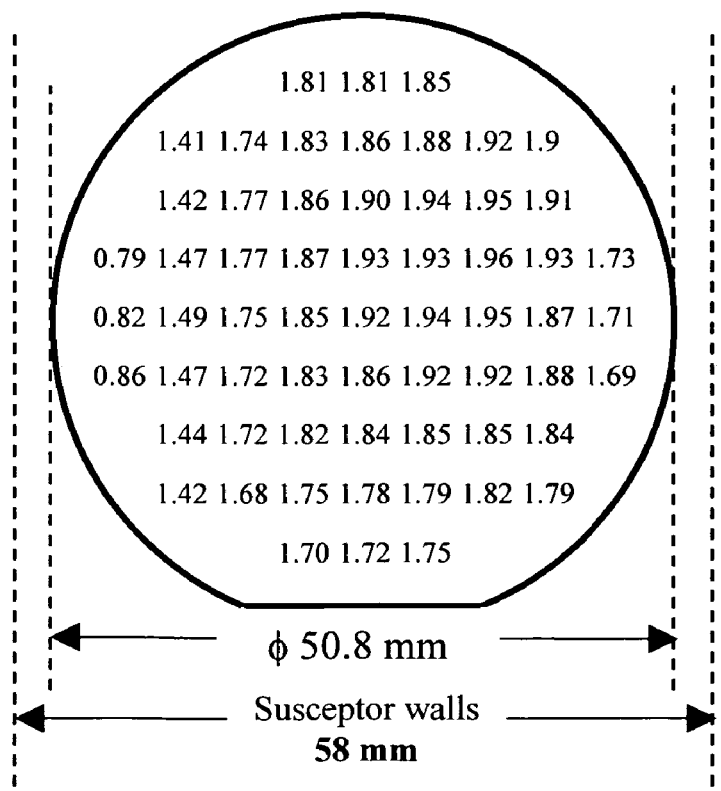
FIG. 4 illustrates a map of the thickness of the epitaxial layer grown at 1300° C. using the growth method of the present invention.

FIG. 4 shows a map of the thickness of the epitaxial layer grown at 1300° C. using the method of the invention. The reactor geometry, for this growth, was optimized for 1-inch diameter substrates. As shown in FIG. 4, the diameter of the substrate is only slightly smaller than the size of the opening in the growth zone (distance between saucepot walls). This reactor geometry is not suitable for growth on substrates having larger diameters when a standard growth process is used. However, in experiments with 2-inch diameter substrates, epitaxial layer growth rate homogeneity along the gas-flow direction obtained with the method of the present invention was much better than what can be expected from the given reactor size when using standard epitaxial growth processes.

The use of halogenated carbon precursors in this method provides an additional benefit of the availability of halogen-containing intermediate chemical products of halogenated carbon precursor decomposition that could induce desirable etching of silicon clusters and release of silicon. While the concept of silicon cluster etching is old, the possibility of releasing of silicon growth species from silicon clusters essentially simultaneously with halogenated carbon precursor dissociation is one of the innovative concepts of this method. A premature release of silicon growth species (for example due to etching by HCl added to the gas flow, see Gao, Y. et al., "Low-temperature Chemical-vapor Deposition of 3C—SiC Films on Si (100) Using $SiH_4$—$C_2H_4$—HCl—$H_2$," *J. Crystal. Growth*, 191, pp. 439-445, 1998) may result in higher than desirable silicon-to-carbon ratio at the undesirable locations in the reactor (i.e., upstream of the susceptor) as well as a possibility of silicon precursor depletion (which results in less silicon being available for the growth at the downstream portion of the substrate/susceptor). In the preferred method, halide-containing gaseous reaction products get formed at the portion of the reactor where halogenated carbon precursors get decomposed. This is due to the fact that halogen-containing intermediate gaseous reaction products come from decomposition of halogenated carbon precursors. However, the role of low-to-moderate temperatures here results in the fact that clusters do not get prematurely dissociated. Instead, they get etched by halogen-containing gaseous reaction products no sooner than when those become available after halogenated carbon precursor decomposition (while the halogenated carbon precursor decomposition is controlled by selecting the flow conditions).

As a result, silicon cluster etching occurs no sooner than halogen-containing intermediate chemical products of halogenated carbon precursor decomposition become available. Therefore, the supply of silicon and carbon atoms (final reaction products required for the growth at the surface) is tied together by the silicon cluster dissociation mechanism tied to halogenated carbon precursor dissociation.

Additionally, the growth method of the present invention is compatible with any doping techniques used for intentional n-type or p-type doping. It includes, but not limited to, adding nitrogen additive for n-type doping or adding aluminum or boron additive for p-type doping. High-purity low-doped n-type or p-type epitaxial layers can be obtained by reducing impurity background in the reactor. In addition, presence of halogen-containing intermediate chemical products in the growth zone of the reactor is used to reduce incorporation of undesirable impurities. Additionally, enablement of the lower growth temperatures by the proposed growth method is used as an additional factor reducing background of undesirable impurities in the reactor. Presence of halogen-containing intermediate chemical products and/or use of low temperatures can be used to enhance formation of specific deep-level defects required for semi-insulating properties of SiC epitaxial layers (e.g., point defect-related deep levels). Higher-quality semi-insulating SiC is obtained when the concentration of both shallow-level and deep-level defects is provided low, which is simplified by presence of halogen-containing intermediate chemical products and/or use of low temperatures as described above.

The invention also includes application of the method of the present invention to grow device-quality epitaxial layers on low off-angle and on-axis SiC substrate surfaces. While the possibility of the lower-temperature growth on low off-angle and on-axis substrates is facilitated by the innovative growth method described above, the low-temperature growth enabled by the new method is used for reducing or completely eliminating the well-known problem of "step-bunching" and other high-temperature-related mechanism of surface morphology degradation, as was demonstrated by using optical microscopy characterization of epitaxial layers growth on low off-angle substrates using the new growth process. The application of the growth at lower temperatures to low off-angle and on-axis substrates is not limited to the method based on halogenated carbon precursors. It may include growth using other precursors (including the traditional propane) at any conditions favorable for a low-temperature growth.

On the other hand, presence of halogen-containing intermediate chemical products by itself reduces defect nucleation on low off-angle and on-axis SiC substrates at any growth temperature, especially at low temperatures. Only rare defects (including triangular defects) were observed at the epilayers surface, and the observed defects were related to low substrate quality.

For example, the growth method of the present invention, at the growth temperature of 1380° C. (higher than during the growth on 8° off-axis substrates but still lower than the standard/traditional growth temperatures) was used for growing on low off-angle and on-axis substrates. The pressure of 150 torr was used. The carrier gas 104 is hydrogen with the flow rate of 1 standard litter per minute. The flows of silane ($SiH_4$) and chloromethane ($CH_3Cl$) were 30 standard cubic centimeters per minute and 4 standard cubic centimeters per minute, respectively. Somewhat higher temperatures may be beneficial for suppressing random defect nucleation while still staying away from the step-bunching that happens at still higher temperatures.

The growth method of the present invention at low-temperature can be also applied with the purpose of forming heterostructures (especially heterostructures with material having lower melting points). For example, silicon layers would be incompatible with SiC growth at temperatures above ~1410° C. (melting point of silicon).

In addition, formation of SiC regions of desirable shape and dimensions by restricting the growth into the windows formed in a non-silicon carbide region on the top of the substrate is possible. The growth method of the present invention applied at low growth temperature enables using lower-temperature masks (such as $SiO_2$, $Si_3N_4$, AlN, etc.) because of decreasing thermal degradation and hydrogen etching of the mask material, and other high-temperature effects. $SiO_2$ mask was initially used to demonstrate this formation. However, other low-temperature masking materials such as $Si_3N_4$ or AlN, high-temperature masking materials such as carbon or graphite, and combination of a few masking materials (multilayer structures) can be used. With high-temperature masking materials, the growth method can be applied also at moderate and high temperatures.

Additionally, the growth method of the present invention at low-temperatures can also be applied to SiC growth for complex device applications that require reduced thermal budget. Examples include, but not limited to, growth that would produce reduced dopant activation after ion implantation and negligible dopant and impurity diffusion during epitaxial growth. It can be also useful, for example, for growth on precisely engineered (especially, thin) buffer layers with tight control of buffer layer thickness, impurity concentration, and impurity activation.

Furthermore, the preferred growth method of the present invention at low-temperatures can be also applied to allow more complex designs of the commercial growth reactors (including the susceptor design) practical for commercial applications. Sophisticated and complex susceptor designs may be prohibitively expensive for higher-temperature growth (because the susceptor requires frequent replacement when operated at high temperature; a frequent replacement of the expensive susceptor is not always economically feasible). Operation at temperatures below 1300-1400° C. eliminates the need in frequent replacement of the expensive susceptor.

The preferred growth method of SiC of the present invention at low-temperature may be applied, but not limited to, to two of the most important SiC polytypes —4H—SiC and 6H—SiC—that traditionally require higher-temperature growth. Additionally, arbitrary substrate surface orientations (including but not limited to the traditional 0001 off-axis substrates) can be used. Alternatively, the method can benefit heteroepitaxial growth. This includes but is not limited to growth of another SiC polytype—3C—SiC—on silicon substrates. In this case, temperatures below the melting point of silicon have to be used.

Experimental Results

First Experiment

Growth experiments were conducted in a low-pressure hot-wall CVD reactor at 150-400 Torr with $H_2$ as the carrier gas, $SiH_4$ (3% in $H_2$) as the silicon source, and $CH_3Cl$ as the carbon source. 8° off-angle substrate surface was used. The epilayer thickness maps were obtained by reflective Fourier Transform Infrared Spectroscopy (FTIR). Epilayer surface morphology was examined by an optical microscope with Nomarski interference contrast, and epilayer quality by low-temperature photoluminescence (PL) spectroscopy.

The growth conditions used in this study involve carrier gas flow rates reduced in comparison to the regular flows normally used for SiC homoepitaxy. Mirror-like surface morphology was observed from Nomarksi micrographs at temperatures down to 1300° C., with the growth rate in excess of 2 µm/hr for this temperature. The shape of the low-temperature PL spectra demonstrated that the epilayers are of good crystalline quality. The spectrum of the epilayer growth at 1300° C. showed strong nitrogen and aluminum bound-exciton lines as well as nitrogen-aluminum and nitrogen-boron donor-acceptor pairs (DAP). However, the absolute intensity of the PL signal and the sharpness of the excitonic lines were found at least as good as that in epitaxial layers grown at 1700° C.

The growth experiments in this work were conducted in the smaller of the two hot-wall CVD reactors. The distance between the sidewalls of the susceptor is only 7 mm larger than the diameter of the 2" substrate. This makes the "sweet-spot" of this reactor noticeably smaller than 2" and therefore more suitable for the process development on smaller substrates. However, prior to scaling the lower-temperature process toward the larger CVD reactor, the growth on 2" substrate at 1300° C. was conducted in the smaller reactor. The surface morphology everywhere except for the ~2 mm regions at the left and right edges of the substrate close to the susceptor walls was found mirror-like. In addition, the homogeneity of the growth rate was much better than expected. While a significant reduction of the growth rate was found near the regions of the degraded morphology close to the susceptor walls (which is natural for the small size of the susceptor used), the (non-optimized) growth rate homogeneity along the gas flow direction was better than 7%. A non-optimized temperature distribution along the gas flow direction is responsible for the major part of the growth rate non-homogeneity.

Second Experiment

Growth conditions similar to those used in the first experiment were applied to grow epitaxial layer on low off-angle substrate (2° off-angle in comparison to 8° off-angle used in the previous experiment). Growth on low off-angle substrates at regular temperatures using standard growth techniques result in surface degraded by so-called step-bunching. The growth on 2° off-angle substrate using the method of the present invention was conducted at 1380° C. The step-bunching problem was completely eliminated. Formation of other defects (e.g., island nucleation) that is usually expected on low off-angle substrate at low temperatures was much lower than expected. The results indicated that the growth method of the present invention can resolve main problems of the growth on low off-angle substrates.

While a preferred embodiment of the invention has been illustrated and described, it will be appreciated that various changes can be made therein without departing from the spirit and scope of the invention. Further, many other advantages of applicant's invention will be apparent to those skilled in the art from the above descriptions and the below claims.

The invention claimed is:

1. A method of producing a silicon carbide epitaxial layer by chemical vapor deposition, the method comprising:
   a) providing a carrier gas, a silicon precursor gas, and a halogenated carbon precursor gas; and
   b) controlling gas-phase interaction of the silicon precursor gas and the halogenated carbon precursor gas to enable formation of halogen-containing intermediate chemical products, wherein the halogen-containing intermediate chemical products provide favorable value and distribution of silicon-to-carbon ratio in the growth zone of the reactor.

2. The method of producing a silicon carbide epitaxial layer by chemical vapor deposition according to claim 1, wherein the silicon carbide epitaxial layer growth is conducted at reduced temperature.

3. The method of producing a silicon carbide epitaxial layer by chemical vapor deposition according to claim 2, wherein growth temperature in the growth zone of the reactor is about 1300° C. to 1450° C.

4. The method of producing a silicon carbide epitaxial layer by chemical vapor deposition according to claim 2, wherein growth temperature in the growth zone of the reactor is about 1100° C. to 1300° C.

5. The method of producing a silicon carbide epitaxial layer by chemical vapor deposition according to claim 1, wherein control of the gas-phase interaction of the silicon precursor gas and the halogenated carbon precursor gas comprises low carrier gas flow velocity in the growth zone of the reactor.

6. The method of producing a silicon carbide epitaxial layer by chemical vapor deposition according to claim 5, wherein the low carrier gas flow velocity is less than about 5 liters per minute in a standard-sized Silicon Carbide reactor.

7. The method of producing a silicon carbide epitaxial layer by chemical vapor deposition according to claim 5, wherein the low carrier gas flow velocity is less than about 1-2 liters per minute in a standard-sized Silicon Carbide reactor.

8. The method of producing a silicon carbide epitaxial layer by chemical vapor deposition according to claim 1, wherein the favorable value of silicon-to-carbon ratio in the growth zone of the reactor is greater than typical values of silicon-to-carbon ratio employed in the standard epitaxial processes for silicon carbide growth.

9. The method of producing a silicon carbide epitaxial layer by chemical vapor deposition according to claim 1, wherein the favorable distribution of silicon-to-carbon ratio in the growth zone of the reactor comprises homogeneous distribution of silicon-to-carbon ratio in the growth zone of the reactor, wherein the homogeneous distribution is achieved by silicon condensation induced in the upstream portion of the reactor and the subsequent release of silicon growth species by dissociation of products of the silicon condensation which occurs essentially simultaneously with halogenated carbon precursor dissociation due to formation of the halogen-containing intermediate chemical products of this dissociation in the gas phase.

10. The method of producing a silicon carbide epitaxial layer by chemical vapor deposition according to claim 1, wherein the effect of the formation of the halogen-containing intermediate chemical products and the favorable value and distribution of silicon-to-carbon ratio in the growth zone of the reactor comprises good homogeneity of the growth rate over the entire area of silicon carbide substrate by having the concentration of silicon species available for the growth homogenized by silicon condensation induced in the upstream portion of the reactor and the subsequent release of silicon growth species by dissociation of products of silicon condensation, which occurs essentially simultaneously with halogenated carbon precursor dissociation by formation of the halogen-containing intermediate chemical products of this dissociation in the gas phase.

11. The method of producing a silicon carbide epitaxial layer by chemical vapor deposition according to claim 1, wherein the halogenated carbon precursor gas comprises at least one of the following $CH_3Cl$, $CH_2Cl_2$, $CHCl_3$, $CCl_4$, $CF_4$ gases.

12. The method of producing a silicon carbide epitaxial layer by chemical vapor deposition according to claim 1, wherein the silicon carbide epitaxial layer comprises high-purity low-doped n-type or high purity low-doped p-type SiC.

13. The method of producing a silicon carbide epitaxial layer by chemical vapor deposition according to claim 1, wherein the silicon carbide epitaxial layer comprises semi-insulating SiC doped with deep-level defects.

14. The method of producing a silicon carbide epitaxial layer by chemical vapor deposition according to claim 1, wherein the silicon carbide epitaxial layer comprises semi-insulating SiC with low concentration of shallow dopants and deep-level defects.

15. The method of producing a silicon carbide epitaxial layer by chemical vapor deposition according to claim 1, wherein the silicon carbide epitaxial layer is formed on a substrate surface that is cut on-axis or low off-angle.

16. The method of producing a silicon carbide epitaxial layer by chemical vapor deposition according to claim 15, wherein growth temperature in the growth zone of the reactor is about 1300° C. to 1450° C.

17. The method of producing a silicon carbide epitaxial layer by chemical vapor deposition according to claim 15, wherein growth temperature in the growth zone of the reactor is about 1100° C. to 1300° C.

18. The method of producing a silicon carbide epitaxial layer by chemical vapor deposition according to claim 1, further comprising restricting growth into at least one window in a non-silicon carbide region on the top of a substrate, wherein at least one SiC region of desirable shape and dimension is formed.

19. The method of producing a silicon carbide epitaxial layer by chemical vapor deposition according to claim 18, wherein the silicon carbide epitaxial layer growth is conducted at reduced temperature.

20. The method of producing a silicon carbide epitaxial layer by chemical vapor deposition according to claim 19, wherein the non-silicon carbide region comprises $SiO_2$, $Si_3N_4$, or AlN.

21. The method of producing a silicon carbide epitaxial layer by chemical vapor deposition according to claim 19, wherein the non-silicon carbide region comprises a multi-layer structure.

22. The method of producing a silicon carbide epitaxial layer by chemical vapor deposition according to claim 21, wherein the multilayer structure comprises at least one layer, in any combination, of $SiO_2$, $Si_3N_4$, and AlN.

23. The method of producing a silicon carbide epitaxial layer by chemical vapor deposition according to claim 19, wherein the at least one SiC region of desirable shape and dimension is formed at growth temperature less than about 1350° C.

24. The method of producing a silicon carbide epitaxial layer by chemical vapor deposition according to claim 19, wherein the at least one SiC region of desirable shape and dimension is formed at growth temperature of about 1100° C. to 1300° C.

25. The method of producing a silicon carbide epitaxial layer by chemical vapor deposition according to claim 18, wherein the at least one SiC region of desirable shape and dimension comprises high-purity low doped n-type or high purity low-doped p-type SiC.

26. The method of producing a silicon carbide epitaxial layer by chemical vapor deposition according to claim 18, wherein the at least one SiC region of desirable shape and dimension comprises semi-insulating SiC doped with deep-level defects.

27. The method of producing a silicon carbide epitaxial layer by chemical vapor deposition according to claim 18, wherein the at least one SiC region of desirable shape and dimension comprises semi-insulating SiC with low concentration of shallow dopants and deep-level defects.

28. The method of producing a silicon carbide epitaxial layer by chemical vapor deposition according to claim 18, wherein the at least one SiC region of desirable shape and dimension is formed on substrate surface that is cut on-axis or low off-angle.

29. The method of producing a silicon carbide epitaxial layer by chemical vapor deposition according to claim 18, wherein the at least one SiC region of desirable shape and dimension is formed using the carrier gas flow rate that is less than about 5 liters per minute in standard sized SiC reactor.

30. The method of producing a silicon carbide epitaxial layer by chemical vapor deposition according to claim 18, wherein the at least one SiC region of desirable shape and dimension is formed using the carrier gas flow rate that is less than about 1-2 liters per minute in standard sized SiC reactor.

31. A method of achieving a device-quality silicon carbide epitaxial layer on a substrate surface that is cut on-axis or low-off angle, wherein defect generation for on-axis or low-off angle substrates is suppressed by conducting growth at reduced temperature.

* * * * *